(12) United States Patent
Li

(10) Patent No.: US 11,508,759 B2
(45) Date of Patent: Nov. 22, 2022

(54) METHOD OF MANUFACTURING FLEXIBLE ARRAY SUBSTRATE, FLEXIBLE ARRAY SUBSTRATE, AND FLEXIBLE DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zhuhui Li, Shenzhen (CN)

( * ) Notice: Subject to any disclaimer, the term of this patent is extended or adjusted under 35 U.S.C. 154(b) by 340 days.

(21) Appl. No.: 16/615,135

(22) PCT Filed: Jul. 22, 2019

(86) PCT No.: PCT/CN2019/097136
§ 371 (c)(1),
(2) Date: Nov. 20, 2019

(87) PCT Pub. No.: WO2021/003773
PCT Pub. Date: Jan. 14, 2021

(65) Prior Publication Data
US 2022/0037375 A1    Feb. 3, 2022

(30) Foreign Application Priority Data

Jul. 10, 2019 (CN) .......................... 201910621317.X

(51) Int. Cl.
*H01L 27/12* (2006.01)
*G09F 9/30* (2006.01)

(52) U.S. Cl.
CPC .......... *H01L 27/1244* (2013.01); *G09F 9/301* (2013.01); *H01L 27/127* (2013.01)

(58) Field of Classification Search
CPC ............... H01L 27/1244; H01L 27/127; H01L 27/1218; H01L 27/1259; G09F 9/301
See application file for complete search history.

(56) References Cited

U.S. PATENT DOCUMENTS 8,941,095 B2 * 1/2015 Song ...................... H01Q 1/28
257/29
10,411,222 B2 * 9/2019 Hu ..................... H01L 29/78603
(Continued)

FOREIGN PATENT DOCUMENTS

CN         105841849 A  *  8/2016  ............... G01L 1/16

OTHER PUBLICATIONS

"Modeling nanoscale temperature gradients and conductivity evolution in pulsed light sintering of silver nanowire networks", Michael Dexter et al., IOP Publishing, Nanotechnology 29, 505205. (Year: 2018).*

*Primary Examiner* — S M Sohel Imtiaz
(74) *Attorney, Agent, or Firm* — JMB Davis Ben-David

(57) ABSTRACT

A method of manufacturing a flexible array substrate, a flexible array substrate, and a flexible display device are disclosed. The method of manufacturing the flexible array substrate is implemented by using silver nanowire to form an electrically conductive pattern on a flexible substrate. In this manner, using the silver nanowire to replace metal or indium tin oxide as conventionally used to form the electrically conductive pattern can reduce trace resistance, increase panel transmittance, improve bending resistance of the flexible array substrate, avoid line breaks in products, improve production yield, and reduce manufacturing costs of products.

5 Claims, 4 Drawing Sheets

(56) References Cited

U.S. PATENT DOCUMENTS

| | | | |
|---|---|---|---|
| 2008/0286447 A1* | 11/2008 | Alden | H01L 31/022466 |
| | | | 427/108 |
| 2017/0040402 A1* | 2/2017 | Yasumoto | H01L 29/7869 |
| 2018/0151749 A1* | 5/2018 | Zhang | H01L 27/1225 |
| 2018/0182834 A1* | 6/2018 | Toyotaka | H01L 27/3258 |
| 2019/0115370 A1* | 4/2019 | Fu | H01L 25/0753 |
| 2019/0198584 A1* | 6/2019 | Chen | H01L 51/5253 |
| 2019/0273213 A1* | 9/2019 | Niu | H01L 27/1259 |
| 2019/0371830 A1* | 12/2019 | Hsiao | G06F 3/0445 |
| 2020/0185423 A1* | 6/2020 | Hu | G09F 9/301 |
| 2020/0185627 A1* | 6/2020 | Fang | H01L 29/4908 |

* cited by examiner

METHOD OF MANUFACTURING FLEXIBLE ARRAY SUBSTRATE, FLEXIBLE ARRAY SUBSTRATE, AND FLEXIBLE DISPLAY DEVICE

BACKGROUND OF INVENTION

1. Field of Invention

The present invention relates to a technical field of displays, and particularly to, a method of manufacturing a flexible array substrate, a flexible array substrate, and a flexible display device.

2. Related Art

With development of display technology, flat panel display devices are widely used in various consumer electronic products, such as mobile phones, televisions, personal digital assistants, digital cameras, notebook computers, and desktop computers, due to advantages of high image quality, power saving, compact body, and wide application range, and thus have become the mainstream in display devices.

These days, rigid liquid crystal display devices and rigid organic light-emitting diode (OLED) display devices are used a lot in daily lives, wherein the rigid liquid crystal display devices are mainly used in fixed applications and mobile products, while the rigid OLED display devices are mainly used in mobile products.

Although rigid liquid crystal display devices and rigid OLED display devices can satisfy people's basic needs, with improvement of living standards and development of display technology, people are still looking forward higher requirements for performance of display devices. Currently, new generation of display technology is pointed at flexible display devices. Flexible display devices are configured with flexible substrates to replace traditional glass substrates, thereby fulfilling panel bendability and bringing consumers an innovative concept that enhances user experience and increases product competitiveness. Flexible display devices are favored by panel manufacturers and consumers because of their advantages of being compact, bendable, anti-dropping, and foldable. But, despite having such advantages, flexible display devices also have their disadvantages. At present, biggest disadvantages of flexible display devices are: low yield, high costs, and complicated processes.

The reason for the low yield of the flexible display devices is the poor display performance caused by line breaks of internal traces of the flexible display devices. As to the line breaks, it is because that in order to be flexible, the flexible display devices are thus fabricated with ultra-thin flexible substrates. Additionally, in production processes, flexible substrates are undergoing thermal expansion and contraction resulting in deformation, and production processes necessitated, such as stripping and encapsulation, are all other reasons for causing line breaks of internal traces of flexible display devices.

Materials used for traces of flexible display devices are generally metals such as aluminum, copper, and molybdenum, and pixel electrodes are generally made of indium tin oxide. Whether it is a metal material or indium tin oxide, ductility and bending resistance are relatively low, and it is prone to breakage when applied to flexible display devices.

SUMMARY OF INVENTION

An object of the present invention is to provide a method of manufacturing a flexible array substrate capable of reducing the chances of line breaks of the flexible array substrate, thereby to improve production yield of the flexible array substrate.

Another object of the present invention is to provide a flexible array substrate capable of reducing the chances of line breaks of the flexible array substrate, thereby to improve production yield of the flexible array substrate.

Another object of the present invention is to provide a flexible display device capable of reducing the chances of line breaks of the flexible display device, thereby to improve production yield of the flexible display device.

To achieve the above-mentioned objects, the present invention provides a method of manufacturing a flexible array substrate, comprising forming, using a silver nanowire material, an electrically conductive pattern on a flexible substrate.

The electrically conductive pattern comprises a gate electrode, a source electrode, and a drain electrode; and wherein the forming, using a silver nanowire material, an electrically conductive pattern on a flexible substrate comprises step S1, forming a first silver nanowire layer on the flexible substrate; step S2, forming, by patterning the first silver nanowire layer, the gate electrode; step S3, forming a gate insulating layer on the flexible substrate and the gate electrode; step S4, forming a semiconductor layer corresponding to the gate electrode on the gate insulating layer; step S5, forming a second silver nanowire layer on the gate insulating layer; and step S6, forming, by patterning the second silver nanowire layer, the source electrode and the drain electrode spaced apart from each other, wherein the source electrode and the drain electrode are in contact with two ends of the semiconductor layer.

The electrically conductive pattern further comprises a pixel electrode; and wherein the forming, using a silver nanowire material, an electrically conductive pattern on a flexible substrate further comprises step S7, forming a passivation layer and a via hole on the gate insulating layer, the semiconductor layer, the source electrode, and the drain electrode, wherein the via hole extends through the passivation layer and exposes part of the drain electrode; step S8, forming a third silver nanowire layer on the passivation layer; and step S9, obtaining, by patterning the third silver nanowire layer, the pixel electrode, wherein the pixel electrode contacts the drain electrode through the via hole.

Step S1 comprises coating the flexible substrate with a first silver nanowire film, and obtaining, by sintering the first silver nanowire film using pulsed light, the first silver nanowire layer; and wherein step S5 comprises coating the flexible substrate with a second silver nanowire film, and obtaining, by sintering the second silver nanowire film using pulsed light, the second silver nanowire layer.

Step S8 comprises coating the passivation layer with a third silver nanowire film, and obtaining, by sintering the third silver nanowire film using pulsed light, the third silver nanowire layer.

The method further comprises a step of providing a rigid substrate implemented prior to step S1, and forming the flexible substrate on the rigid substrate.

The method further comprises a step of stripping the flexible substrate from the rigid substrate implemented after step S9.

The present invention further provides a flexible array substrate, comprising a flexible substrate and an electrically conductive pattern disposed on the flexible substrate, wherein a material of the electrically conductive pattern is silver nanowire.

The electrically conductive pattern comprises a gate electrode, a source electrode, a drain electrode, and a pixel electrode; wherein the flexible array substrate has a structure comprising the flexible substrate, the gate electrode disposed on the flexible substrate, a gate insulating layer disposed on the gate electrode, a semiconductor layer disposed on the gate insulating layer above the gate electrode, the source electrode and the drain electrode both disposed on the gate insulating layer and spaced apart from each other, a passivation layer disposed on the gate insulating layer, the semiconductor layer, the source electrode, and the drain electrode, and the pixel electrode disposed on the passivation layer, wherein the source electrode and the drain electrode are in contact with two ends of the semiconductor layer, and the pixel electrode contacts the drain electrode through a via hole extending through the passivation layer and exposing part of the drain electrode.

The present invention further provides a flexible display device comprising the flexible array substrate.

The present invention has advantageous effects as follows: the present invention provides a method of manufacturing a flexible array substrate, a flexible array substrate, and a flexible display device. The method of manufacturing the flexible array substrate is implemented by using silver nanowire to form an electrically conductive pattern on a flexible substrate. In this manner, using the silver nanowire to replace metal or indium tin oxide as conventionally used to form the electrically conductive pattern can reduce trace resistance, increase panel transmittance, improve bending resistance of the flexible array substrate, avoid line breaks in products, improve production yield, and reduce manufacturing costs of products.

BRIEF DESCRIPTION OF DRAWINGS

In order to further understand the features and technical contents of the present invention, please refer to the following detailed description and drawings related to the present invention. However, the drawings are provided only for purposes of illustration and description, and are not intended to limit the present invention.

DESCRIPTION OF PREFERRED EMBODIMENTS

Figure 1:
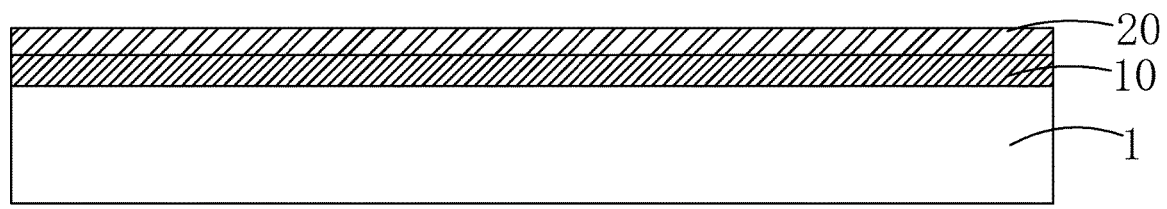
FIG. 1 is a schematic view showing step S1 of a method of manufacturing a flexible array substrate of the present invention.

In order to further clarify the technical means and effects of the present invention, the following detailed description will be made in conjunction with the preferred embodiments of the invention and the accompanying drawings.

Please refer to FIGS. 1 to 7. The present invention provides a method of manufacturing a flexible array substrate, including forming an electrically conductive pattern on a flexible substrate 10 using a silver nanowire material.

Specifically, in the preferable embodiment of the present invention, as shown in FIGS. 1 to 4, the electrically conductive pattern includes a gate electrode 21, a source electrode 22, and a drain electrode 23.

Accordingly, the step of forming the electrically conductive pattern on the flexible substrate 10 includes:

Step S1, forming a first silver nanowire layer 20 on the flexible substrate 10.

Specifically, as shown in FIG. 1, a step of providing a rigid substrate 1 is implemented prior to step S1, and the flexible substrate 10 is formed on the rigid substrate 1.

Preferably, the flexible substrate 10 is made of polyimide, and the rigid substrate 1 is a glass substrate.

Further, a process of forming the first silver nanowire layer 20 includes: first, coating the flexible substrate 10 with a first silver nanowire film, wherein the first silver nanowire film includes a plurality of silver nanowire segments interconnected with each other; and next, obtaining the first silver nanowire layer 20 by sintering the first silver nanowire film using pulsed light. The silver nanowire segments interconnected with each other are sintered together by sintering the first silver nanowire film using pulsed light, thereby to improve electrically conductivity and mechanical properties of silver nanowire, and finally forming the first silver nanowire layer 20 in a web-like formation.

Figure 2:
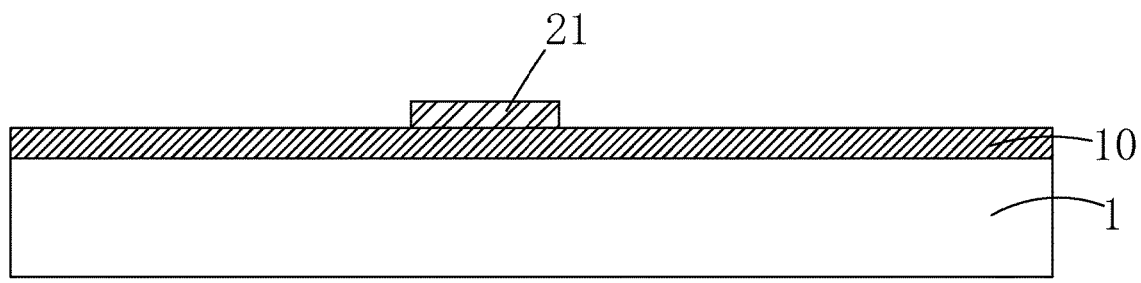
FIG. 2 is a schematic view showing step S2 of the method of manufacturing the flexible array substrate of the present invention.

Step S2, as shown in FIG. 2, forming the gate electrode 21 by patterning the first silver nanowire layer 20.

Specifically, step S2 includes forming a photoresist layer on the first silver nanowire layer 20, followed by exposure, development, and etching to obtain the gate electrode 21.

Figure 3:
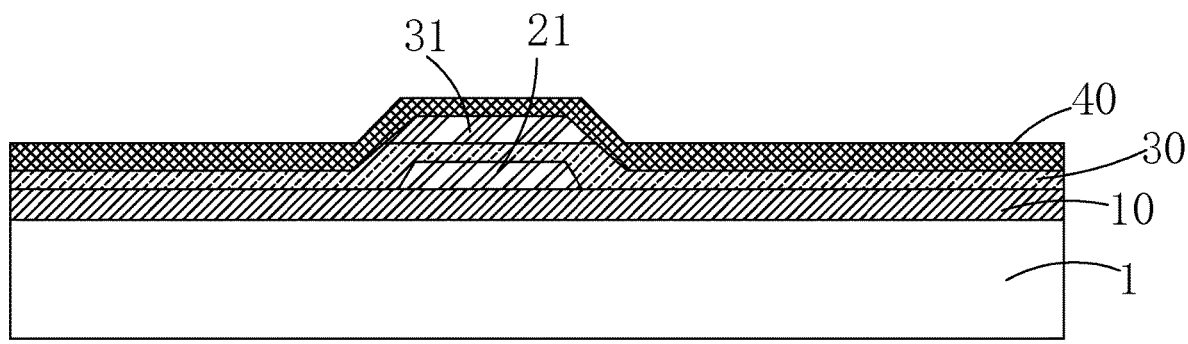
FIG. 3 is a schematic view showing steps S3-S5 of the method of manufacturing the flexible array substrate of the present invention.

Step S3, as shown in FIG. 3, forming a gate insulating layer 30 on the flexible substrate 10 and the gate electrode 21.

Specifically, the gate insulating layer 30 is made of one or a combination of silicon nitride and silicon oxide.

Step S4, as shown in FIG. 3, forming a semiconductor layer 31 corresponding to the gate electrode 21 on the gate insulating layer 30.

Step S5, as shown in FIG. 3, forming a second silver nanowire layer 40 on the gate insulating layer 30.

Specifically, a process of forming the second silver nanowire layer 40 includes: first, coating the gate insulating layer 30 with a second silver nanowire film, wherein the second silver nanowire film includes a plurality of silver nanowire segments interconnected with each other; and next, obtaining the second silver nanowire layer 40 by sintering the second silver nanowire film using pulsed light. The silver nanowire segments interconnected with each other are sintered together by sintering the second silver nanowire film using pulsed light, thereby to improve electrically conductivity and mechanical properties of silver nanowire, and finally forming the second silver nanowire layer 40 in a web-like formation.

Figure 4:
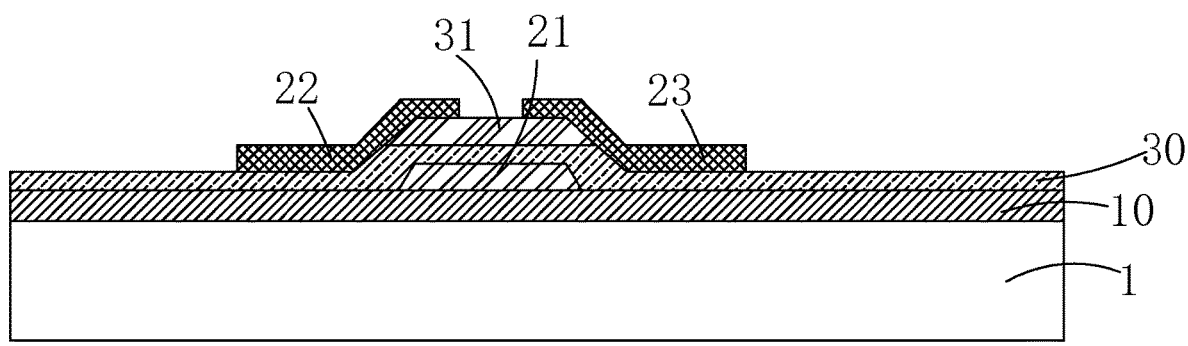
FIG. 4 is a schematic view showing step S6 of the method of manufacturing the flexible array substrate of the present invention.

Step S6, as shown in FIG. 4, forming the source electrode 22 and the drain electrode 23 spaced apart from each other by patterning the second silver nanowire layer 40, wherein the source electrode 22 and the drain electrode 23 are in contact with two ends of the semiconductor layer 31.

Specifically, step S6 includes forming a photoresist layer on the second silver nanowire layer 40, followed by exposure, development, and etching to obtain the source electrode 22 and the drain electrode 23.

Figure 5:
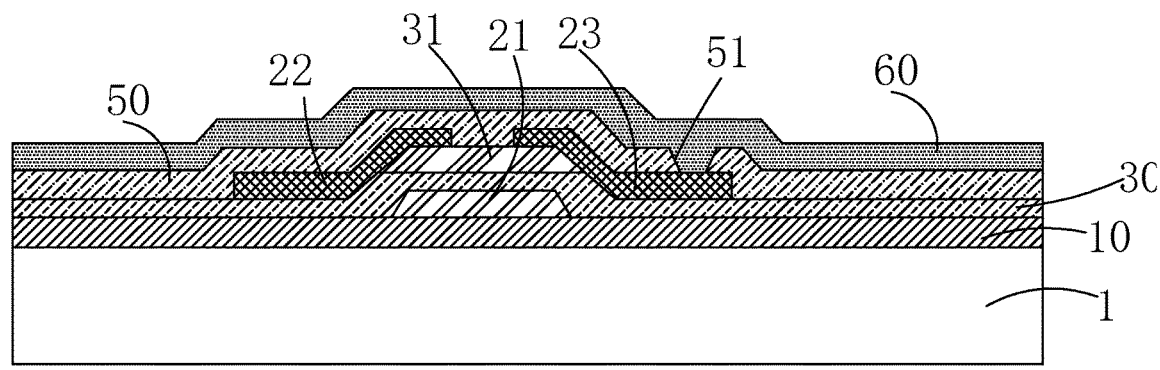
FIG. 5 is a schematic view showing steps S7-S8 of the method of manufacturing the flexible array substrate of the present invention.
Figure 6:
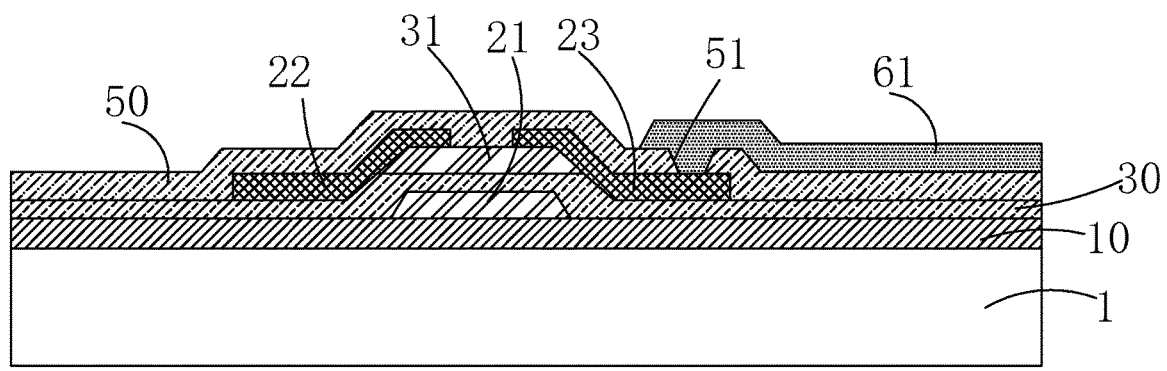
FIG. 6 is a schematic view showing step S9 of the method of manufacturing the flexible array substrate of the present invention.

Further, as shown in FIGS. 5 and 6, in a preferable embodiment of the present invention, the electrically conductive pattern further comprises a pixel electrode 61.

The step of forming the electrically conductive pattern on the flexible substrate 10 includes:

Step S7, forming a passivation layer 50 and a via hole 51 on the gate insulating layer 30, the semiconductor layer 31, the source electrode 22, and the drain electrode 23, wherein the via hole 51 extends through the passivation layer 50 and exposes part of the drain electrode 23.

Specifically, the passivation layer 50 is made of one or a combination of silicon oxide and silicon nitride.

Step S8, forming a third silver nanowire layer 60 on the passivation layer 50.

Specifically, a process of forming the third silver nanowire layer 60 includes: first, coating the passivation layer 50 with a third silver nanowire film, wherein the third silver nanowire film includes a plurality of silver nanowire segments interconnected with each other; and next, obtaining the third silver nanowire layer 60 by sintering the third silver nanowire film using pulsed light. The silver nanowire segments interconnected with each other are sintered together by sintering the third silver nanowire film using pulsed light, thereby to improve electrically conductivity and mechanical properties of silver nanowire, and finally forming the third silver nanowire layer 60 in a web-like formation.

Step S9, obtaining the pixel electrode 61 by patterning the third silver nanowire layer 60, wherein the pixel electrode 61 contacts the drain electrode 23 through the via hole 51.

Specifically, step S9 includes forming a photoresist layer on the third silver nanowire layer 60, followed by exposure, development, and etching to obtain the pixel electrode 61.

Figure 7:
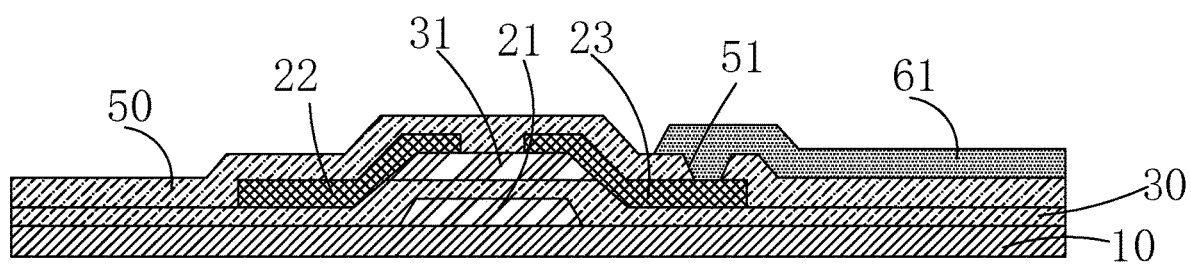
FIG. 7 is a schematic view of a flexible array substrate of the present invention.

Further, as shown in FIG. 7, a step of stripping the flexible substrate 10 from the rigid substrate 1 is implemented after step S9, so that the flexible array substrate is finalized.

It should be noted that based on characteristics of the silver nanowire of simple film forming processes, low resistance, low costs, bending resistance, good ductility, high transmittance, low haze, and being patterned by photolithography processes, the present invention utilizes the silver nanowire to replace metal or indium tin oxide as used currently to form an electrically conductive pattern of a flexible array substrate, thereby to reduce trace resistance, increase panel transmittance, improve bending resistance of the flexible array substrate, avoid line breaks in products, improve production yield, and reduce manufacturing costs of products.

Please refer to FIG. 7. The present invention further provides a flexible array including a flexible substrate 10 and an electrically conductive pattern disposed on the flexible substrate 10, wherein a material of the electrically conductive pattern is silver nanowire.

Specifically, the electrically conductive pattern includes a gate electrode 21, a source electrode 22, a drain electrode 23, and a pixel electrode 61.

The flexible array substrate has a structure including the flexible substrate 10, the gate electrode 21 disposed on the flexible substrate 10, a gate insulating layer 30 disposed on the gate electrode 21, a semiconductor layer 31 disposed on the gate insulating layer 30 above the gate electrode 21, the source electrode 22 and the drain electrode 23 both disposed on the gate insulating layer 30 and spaced apart from each other, a passivation layer 50 disposed on the gate insulating layer 30, the semiconductor layer 31, the source electrode 22, and the drain electrode 23, and the pixel electrode 61 disposed on the passivation layer 50, wherein the source electrode 22 and the drain electrode 23 are in contact with two ends of the semiconductor layer 31, and the pixel electrode 61 contacts the drain electrode 23 through a via hole 51 extending through the passivation layer 50 and exposing part of the drain electrode 23.

Preferably, the flexible substrate 10 is made of polyimide, and the rigid substrate 1 is a glass substrate. The gate insulating layer 30 is made of one or a combination of silicon nitride and silicon oxide. The passivation layer 50 is made of one or a combination of silicon oxide and silicon nitride.

It should be noted that based on characteristics of the silver nanowire of simple film forming processes, low resistance, low costs, bending resistance, good ductility, high transmittance, low haze, and being patterned by photolithography processes, the present invention utilizes the silver nanowire to replace metal or indium tin oxide as used currently to form an electrically conductive pattern of a flexible array substrate, thereby to reduce trace resistance, increase panel transmittance, improve bending resistance of the flexible array substrate, avoid line breaks in products, improve production yield, and reduce manufacturing costs of products.

In accordance with the above-mentioned flexible array substrate, the present invention further provides a flexible display device including the flexible array substrate as described above.

Accordingly, the present invention provides a method of manufacturing a flexible array substrate, a flexible array substrate, and a flexible display device. The method of manufacturing the flexible array substrate is implemented by using silver nanowire to form an electrically conductive pattern on a flexible substrate. In this manner, using the silver nanowire to replace metal or indium tin oxide as conventionally used to form the electrically conductive pattern can reduce trace resistance, increase panel transmittance, improve bending resistance of the flexible array substrate, avoid line breaks in products, improve production yield, and reduce manufacturing costs of products.

Accordingly, those skilled in the art without departing from the technical solutions and ideas of the present invention may make various changes or modifications, and thus the scope of the present invention should be after the appended claims and their equivalents.

What is claimed is:

1. A method of manufacturing a flexible array substrate, comprising:

forming, using a silver nanowire material, an electrically conductive pattern on a flexible substrate, wherein the electrically conductive pattern comprises a gate electrode, a source electrode, a drain electrode, and a pixel electrode;

wherein the forming, using the silver nanowire material, the electrically conductive pattern on the flexible substrate comprises:

step S1, forming a first silver nanowire layer on the flexible substrate;

step S2, forming, by patterning the first silver nanowire layer, the gate electrode;

step S3, forming a gate insulating layer on the flexible substrate and the gate electrode;

step S4, forming a semiconductor layer corresponding to the gate electrode on the gate insulating layer;

step S5, forming a second silver nanowire layer on the gate insulating layer;

step S6, forming, by patterning the second silver nanowire layer, the source electrode and the drain electrode spaced apart from each other, wherein the source electrode and the drain electrode are in contact with two ends of the semiconductor layer;

step S7, forming a passivation layer and a via hole on the gate insulating layer, the semiconductor layer, the source electrode, and the drain electrode, wherein the via hole extends through the passivation layer and exposes part of the drain electrode;

step S8, forming a third silver nanowire layer on the passivation layer; and step S9, obtaining, by patterning the third silver nanowire layer, the pixel electrode, wherein the pixel electrode contacts the drain electrode through the via hole.

2. The method of manufacturing the flexible array substrate of claim 1, wherein step S1 comprises coating the flexible substrate with the first silver nanowire film, and obtaining, by sintering the first silver nanowire film using pulsed light, the first silver nanowire layer; and wherein step S5 comprises coating the flexible substrate with the second silver nanowire film, and obtaining, by sintering the second silver nanowire film using pulsed light, the second silver nanowire layer.

3. The method of manufacturing the flexible array substrate of claim 1, wherein step S8 comprises coating the passivation layer with the third silver nanowire film, and obtaining, by sintering the third silver nanowire film using pulsed light, the third silver nanowire layer.

4. The method of manufacturing the flexible array substrate of claim 1, further comprising a step of providing a rigid substrate implemented prior to step S1, and forming the flexible substrate on the rigid substrate.

5. The method of manufacturing the flexible array substrate of claim 4, further comprising a step of stripping the flexible substrate from the rigid substrate implemented after step S9.

\* \* \* \* \*